(12) United States Patent
Worledge

(10) Patent No.: US 9,035,403 B2
(45) Date of Patent: May 19, 2015

(54) SPIN-TORQUE MAGNETORESISTIVE STRUCTURES

(71) Applicant: International Business Machines Corporation, Armonk, NY (US)

(72) Inventor: Daniel Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/173,161

(22) Filed: Feb. 5, 2014

(65) Prior Publication Data

US 2014/0151828 A1 Jun. 5, 2014

Related U.S. Application Data

(63) Continuation of application No. 12/475,057, filed on May 29, 2009, now Pat. No. 8,686,520.

(51) Int. Cl.
| | |
|---|---|
| *H01L 43/00* | (2006.01) |
| *G11C 11/02* | (2006.01) |
| *H01L 27/22* | (2006.01) |
| *H01L 43/08* | (2006.01) |
| *H01L 43/12* | (2006.01) |
| *H01L 43/04* | (2006.01) |

(52) U.S. Cl.
CPC ............... *H01L 27/222* (2013.01); *H01L 43/08* (2013.01); *H01L 43/12* (2013.01); *H01L 43/04* (2013.01)

(58) Field of Classification Search
CPC ........ H01L 43/08; G11C 11/14; G11C 11/15; G11C 11/16; G11C 11/161
USPC ................... 257/421, E43.004; 365/158, 171
See application file for complete search history.

(56) References Cited

U.S. PATENT DOCUMENTS

| | | |
|---|---|---|
| 6,341,053 B1 | 1/2002 | Nakada et al. |
| 6,985,385 B2 | 1/2006 | Nguyen et al. |
| 7,053,430 B2 | 5/2006 | Katti |

(Continued)

FOREIGN PATENT DOCUMENTS

| | | |
|---|---|---|
| JP | 2001156357 A | 6/2001 |
| JP | 2005510047 A | 4/2005 |

(Continued)

OTHER PUBLICATIONS

Dr. G. Pan, "MRAM—Present State-of-the-Art and Future Challenges," Jan. 2008, 30 pages.

(Continued)

*Primary Examiner* — Allison P Bernstein
(74) *Attorney, Agent, or Firm* — Vazken Alexanian; Ryan, Mason & Lewis, LLP

(57) ABSTRACT

Magnetoresistive structures, devices, memories, and methods for forming the same are presented. For example, a magnetoresistive structure includes a first ferromagnetic layer, a first nonmagnetic spacer layer proximate to the first ferromagnetic layer, a second ferromagnetic layer proximate to the first nonmagnetic spacer layer, and a first antiferromagnetic layer proximate to the second ferromagnetic layer. For example, the first ferromagnetic layer may comprise a first pinned ferromagnetic layer, the second ferromagnetic layer may comprise a free ferromagnetic layer, and the first antiferromagnetic layer may comprise a free antiferromagnetic layer.

20 Claims, 3 Drawing Sheets

(56) References Cited

U.S. PATENT DOCUMENTS

| | | |
|---|---|---|
| 7,110,287 B2 | 9/2006 | Huai et al. |
| 2004/0170055 A1* | 9/2004 | Albert et al. .................. 365/173 |
| 2005/0002228 A1 | 1/2005 | Dieny et al. |
| 2007/0171694 A1 | 7/2007 | Huai et al. |
| 2007/0215967 A1 | 9/2007 | Wu et al. |
| 2008/0049488 A1 | 2/2008 | Rizzo |
| 2008/0179699 A1 | 7/2008 | Horng et al. |
| 2008/0247072 A1 | 10/2008 | Nozieres et al. |

FOREIGN PATENT DOCUMENTS

| | | |
|---|---|---|
| JP | 2007299931 A | 11/2007 |
| KR | 200600087525 A | 8/2006 |
| KR | 20070106454 A | 11/2007 |

OTHER PUBLICATIONS

P.M. Haney et al., "Ab Initio giant magnetoresistance and current-induced torques in Cr/Au/Cr multilayers," APS Journals, 2007, 7 pages, Phys. Rev. B. vol. 75, Issue 17, Phys.

J. Wang et al., "Low-Current Blocking Temperature Writing of Double Barrier Magnetic Random Access Memory Cells," American Institute of Physics, Applied Physics Letters, Feb. 2004, pp. 945-947, vol. 84, No. 6.

Z. Diao et al., "Spin Transfer Switching and Spin Polarization in Magnetic Tunnel Junctions with MgO an AlOx Barriers," American Institute of Physics, Applied Physics Letters, Dec. 2005, 3 pages, vol. 87, No. 232502.

C-T. Yen et al., "Reduction in Critical Current Density for Spin Torque Transfer Switching with Composite Free Layer," American Institute of Physics, Applied Physics Letters, Sep. 2008, 3 pages, vol. 93, No. 092504.

Y. Huai et al., "Spin Transfer Switching Current Reduction in Magnetic Tunnel Junction Based Dual Spin Filter Structures," American Institute of Physics, Applied Physics Letters, Nov. 2005, 3 pages, vol. 87, No. 222510.

H. Meng et al., "Low Critical Current for Spin Transfer in Magnetic Tunnel Junctions," American Institute of Physics, Applied Physics Letters, Feb. 2006, 3 pages, vol. 88, No. 082504.

H. Meng et al., "Spin Transfer Effect in Magnetic Tunnel Junction with a Nano-Current-Channel layer in Free Layer," IEEE Transactions on Magnetics, Oct. 2005, pp. 2612-2614, vol. 41, No. 10.

* cited by examiner

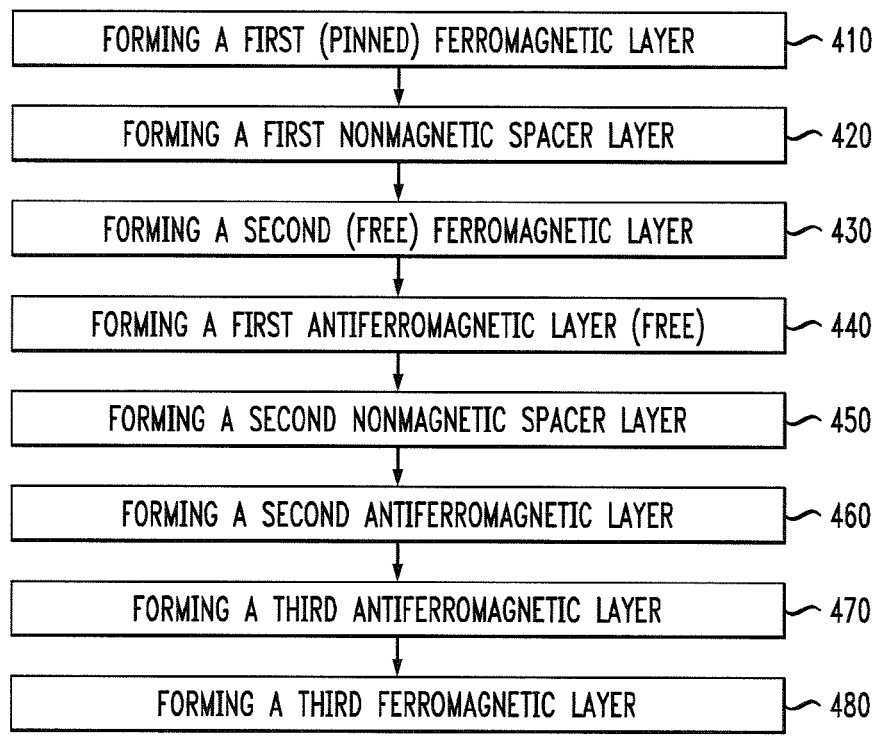
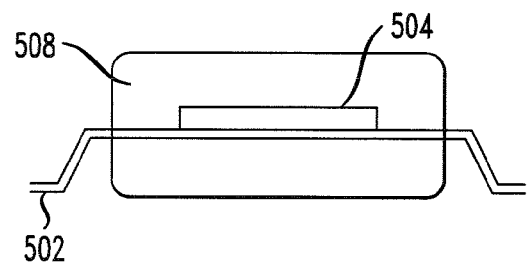

SPIN-TORQUE MAGNETORESISTIVE STRUCTURES

CROSS-REFERENCE TO RELATED APPLICATION

This application is a Continuation of U.S. patent application Ser. No. 12/475,057, filed on May 29, 2009, now U.S. Pat. No. 8,686,520, the disclosure of which is incorporated herein by reference.

FIELD

The present invention relates generally to magnetoresistive structures, spintronics, memory, and integrated circuits. More particularly the invention relates to spin-torque magnetoresistive structures and devices including spin-torque based magnetoresistive random access memory (MRAM).

BACKGROUND

Magnetoresistive random access memories (MRAMs) combine magnetic components with standard silicon-based microelectronics to achieve non-volatile memory. For example, silicon based microelectronics comprise electronic devices such as transistors, diodes, resistors, interconnect, capacitors or inductors. Transistors comprise field effect transistors and bipolar transistors. An MRAM memory cell comprises a magnetoresistive structure that stores a magnetic moment that is switched between two directions corresponding to two data states ("1" and "0"). In an MRAM cell, information is stored in magnetization directions of a free magnetic layer. In a conventional spin-transfer MRAM memory cell, the data state is programmed to a "1" or to a "0" by forcing a write current directly through the stack of layers of materials that make up the MRAM cell. Generally speaking, the write current, which is spin polarized by passing through one layer, exerts a spin-torque on a subsequent free magnetic layer. The torque switches the magnetization of the free magnetic layer between two stable states depending upon the polarity of the write current.

SUMMARY

Principles of the invention provide, for example, a free antiferromagnetic layer exchange coupled and proximate to a free ferromagnetic layer. Principles of the invention further provide a sub-structure comprising the free antiferromagnetic layer, a pinned antiferromagnetic layer, and a giant magnetoresistance nonmagnetic spacer layer located between the free and the pinned antiferromagnetic layers. The sub-structure is adapted to provide a majority of spin-torque for switching magnetic polarization of the free ferromagnetic layer.

For example, in accordance with one aspect of the invention, a magnetoresistive structure is provided. The magnetoresistive structure includes a first ferromagnetic layer, a first nonmagnetic spacer layer proximate to the first ferromagnetic layer, a second ferromagnetic layer proximate to the first nonmagnetic spacer layer, and a first antiferromagnetic layer proximate to the second ferromagnetic layer. For example, the first ferromagnetic layer may comprise a first pinned ferromagnetic layer, the second ferromagnetic layer may comprise a free ferromagnetic layer, and the first antiferromagnetic layer may comprise a free antiferromagnetic layer.

In accordance with another aspect of the invention, a magnetoresistive memory device is provided. The magnetoresistive memory device comprises a first ferromagnetic layer, a first nonmagnetic spacer layer proximate to the first ferromagnetic layer, a second ferromagnetic layer proximate to the first nonmagnetic spacer layer, and a first antiferromagnetic layer proximate to the second ferromagnetic layer. For example, the first ferromagnetic layer may comprise a first pinned ferromagnetic layer, the second ferromagnetic layer may comprise a free ferromagnetic layer, and the first antiferromagnetic layer may comprise a free antiferromagnetic layer. The magnetoresistive memory device stores at least two data states corresponding to at least two directions of a magnetic moment.

In accordance with another aspect of the invention, an integrated circuit is provided. The integrated circuit comprises a substrate, a first ferromagnetic layer, a first nonmagnetic spacer layer proximate to the first ferromagnetic layer, a second ferromagnetic layer proximate to the first nonmagnetic spacer layer, and a first antiferromagnetic layer proximate to the second ferromagnetic layer. For example, the first ferromagnetic layer may comprise a first pinned ferromagnetic layer, the second ferromagnetic layer may comprise a free ferromagnetic layer, and the first antiferromagnetic layer may comprise a free antiferromagnetic layer.

In accordance with yet another aspect of the invention, a method for forming a spin-torque device is provided. The method comprises forming a first ferromagnetic layer, forming a first nonmagnetic spacer layer proximate to the first ferromagnetic layer, forming a second ferromagnetic layer proximate to the first nonmagnetic spacer layer and comprising a free ferromagnetic layer, and forming a first antiferromagnetic layer proximate to the second ferromagnetic layer. The first antiferromagnetic layer comprises a free antiferromagnetic layer.

Structures, devices, memories and methods of the invention are adapted to changing the direction of the magnetic moment of the free ferromagnetic layer using less write current than write current required for a conventional spin-torque transfer magnetoresistive device. A magnetoresistive memory may be a magnetoresistive random access memory (MRAM) comprising an embodiment of the spin-torque transfer magnetoresistive device of the invention. The MRAM is adapted for writing data using much less write current than write current required for a conventional spin-torque MRAM. Aspects of the invention provide for lower switching current in spin-torque switched nanostructures while providing thermal stability.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 4 illustrates a method for forming a spin-torque structure, according to an embodiment of the present invention.

FIG. 5 is a cross-sectional view depicting an exemplary packaged integrated circuit, according to an embodiment of the present invention.

DETAILED DESCRIPTION

Figure 1:
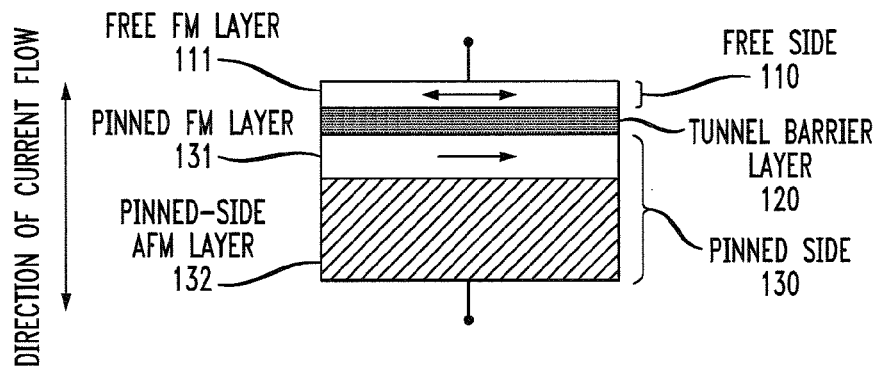
FIG. 1 illustrates a conventional spin-torque magnetoresistive structure.

Principles of the present invention will be described herein in the context of exemplary spin-torque switched devices and method for use therewith. It is to be understood, however, that the techniques of the present invention are not limited to the devices and method shown and described herein. Rather, embodiments of the invention are directed to techniques for reducing switching current in spin-torque switched devices. Although embodiments of the invention may be fabricated using the materials described below, alternate embodiments may be fabricated using other materials. The drawings are not drawn to scale. Thicknesses of various layers depicted by the drawings are not necessarily indicative of thicknesses of the layers of embodiments of the invention. For the purposes of clarity, some commonly used layers, well known in the art, have not been illustrated in the drawings, including but not limited to protective cap layers, seed layers, and an underlying substrate. The substrate may be a conventional semiconductor substrate, such as silicon, or any other suitable structure.

The term proximate or proximate to, as used herein, has meaning inclusive of, but not limited to, abutting, in contact with, and operatively in contact with. In particular and with respect to magnetic coupling, proximate or proximate to includes, but is not limited to, being operatively magnetically coupled. The term abut(s) or abutting, as used herein, has meaning that includes, but is not limited to, being proximate to.

Ferromagnetic materials exhibit parallel alignment of atomic magnetic moments resulting in relatively large net magnetization even in the absence of a magnetic field. The parallel alignment effect only occurs at temperatures below a certain critical temperature, called the Curie temperature.

The atomic magnetic moments in ferromagnetic materials exhibit very strong interactions produced by electronic exchange forces and result in parallel alignment of atomic magnetic moments. Exchange forces can be very large, for example, equivalent to a field on the order of 1000 Tesla. The exchange force is a quantum mechanical phenomenon due to the relative orientation of the spins of two electrons. The elements Fe, Ni, and Co and many of their alloys are typical ferromagnetic materials. Two distinct characteristics of ferromagnetic materials are their spontaneous magnetization and the existence of magnetic ordering temperatures (i.e., Curie temperatures). Even though electronic exchange forces in ferromagnets are very large, thermal energy eventually overcomes the exchange and produces a randomizing effect. This occurs at a particular temperature called the Curie temperature ($T_c$). Below the Curie temperature, the ferromagnet is ordered and above it, disordered. The saturation magnetization goes to zero at the Curie temperature.

Antiferromagnetic materials are materials having magnetic moments of atoms or molecules, usually related to the spins of electrons, align in a regular pattern with neighboring spins, on different sublattices, pointing in opposite directions. Generally, antiferromagnetic order may exist at sufficiently low temperatures, vanishing at and above a certain temperature, the Néel temperature. Below the Néel temperature, the antiferromagnet is ordered and above it, disordered. When no external magnetic field is applied, the antiferromagnetic material corresponds to a vanishing total magnetization.

Antiferromagnets can couple to ferromagnets, for instance, through a mechanism known as exchange anisotropy (for, example, wherein an aligning magnetic field is applied either when a ferromagnetic film is grown upon the antiferromagnet or during subsequent annealing) causing the surface atoms of the ferromagnet to align with the surface atoms of the antiferromagnet. This provides the ability to pin the orientation of a ferromagnetic film. The temperature at or above which an antiferromagnetic layer loses its ability to pin the magnetization direction of an adjacent ferromagnetic layer is called the blocking temperature of that layer and is usually lower than the Néel temperature.

Giant magnetoresistance (GMR) is a quantum mechanical magnetoresistance effect observed in certain structures, for example, structures comprising two ferromagnetic layers with a nonmagnetic spacer layer between the two ferromagnetic layers. The magnetoresistance effect manifests itself as a significantly lower electrical resistance of the structure, due to relatively little magnetic scattering, when the magnetizations of the two magnetic layers are parallel. The magnetizations of the two magnetic layers may be made parallel by, for example, placing the structure within an external magnetic field. The giant magnetoresistance effect further manifests itself as a significantly higher electrical resistance of the structure, due to relatively high magnetic scattering, when the magnetizations of the two magnetic layers are anti-parallel. A giant magnetoresistance spacer layer is the nonmagnetic spacer layer between the two ferromagnetic layers, wherein the structure comprising these layers shows the GMR effect.

Tunnel magnetoresistance (TMR) is a magnetoresistive effect that occurs in magnetic tunnel junctions (MTJs). A MTJ is a component consisting of two magnets separated by a thin insulator. If the insulating layer is thin enough (typically a few nanometers), electrons can tunnel from one magnet into the other. Since this process is forbidden in classical physics, TMR is a strictly quantum mechanical phenomenon.

The term nonmagnetic metal, as used herein, means a metal that is not magnetic including not ferromagnetic and not antiferromagnetic.

Magnetic anisotropy is the direction dependence of magnetic properties of a material. A magnetically isotropic material has no preferential direction for a magnetic moment of the material in a zero magnetic field, while a magnetically anisotropic material will tend to align its moment to an easy axis. There are different sources of magnetic anisotropy, for example: magnetocrystalline anisotropy, wherein the atomic structure of a crystal introduces preferential directions for the magnetization; shape anisotropy, when a particle is not perfectly spherical, the demagnetizing field will not be equal for all directions, creating one or more easy axes; stress anisotropy, wherein tension may alter magnetic behavior, leading to magnetic anisotropy; and exchange anisotropy that occurs when antiferromagnetic and ferromagnetic materials interact. The Anisotropy field ($H_k$) may be defined as the weakest magnetic field which is capable of switching the magnetization of the material from the easy axis.

A conventional spin-torque transfer magnetoresistive structure or spin-torque magnetoresistive random access memory (MRAM) may comprise a two-terminal device 100 shown in FIG. 1 comprising, in a magnetic tunnel junction stack, a free side 110 comprising a free ferromagnetic layer (FM layer) 111, tunnel barrier layer 120, and pinned side 130 comprising a pinned FM layer 131 and a pinned-side antiferromagnetic layer (AFM layer) 132. A tunnel junction comprises the tunnel barrier layer 120 between the free side 110 and the pinned side 130. The direction of the magnetic moment of the pinned FM layer 131 is fixed in direction (e.g., pointing to the right) by the pinned-side AFM layer 132. A current passed down through the tunnel junction makes magnetization of the free FM layer 111 parallel to the magnetization of the pinned FM layer 131, e. g., pointing to the right. A current passed up through the tunnel junction makes the magnetization of the free FM layer 111 anti-parallel to the magnetization of the pinned FM layer 131, e.g., pointing to the left. A smaller current through the device 100, passing up or passing down, is used to read the resistance of the device 100, which depends on the relative orientations of the magnetizations of the free FM layer 111 and the pinned FM layer 131.

In a conventional spin-torque transfer magnetoresistive structure or conventional spin-torque magnetoresistive MRAM, it is realized that the free magnetic layer is a ferromagnet or ferrimagnet, not an antiferromagnet, and that an antiferromagnet layer may be used, but as part of a pinned layer, not as part of a free layer. A pinned layer has its magnetization fixed in direction and does not switch.

Conventional spin-torque MRAM has several issues. One issue is the need to reduce write current needed to switch the MRAM cells. This invention solves this problem by incorporating an antiferromagnetic layer into the free layer.

A relatively small switching (write) current can be realized in a spin-torque antiferromagnetic structure comprising three layers. The first layer is a first antiferromagnet. The second layer is a nonmagnetic metal. The third layer is a second antiferromagnet. The nonmagnetic metal is between the first and second antiferromagnets. For example, the first and second antiferromagnets comprise chromium (Cr) and the nonmagnetic metal comprises gold (Au). This antiferromagnetic structure may have a critical switching currents one hundred times smaller than critical switching currents in a ferromagnetic structure having ferromagnets in place of the first and second antiferromagnets. The reduced critical switching current is because of a reduced demagnetization field in an antiferromagnet compared to a ferromagnet. However, this antiferromagnetic structure is not useful as an MRAM because there is no known way to sense (read) the magnetization state of the structure. An aspect of the current invention is a new spin-torque device which incorporates the antiferromagnetic structure and the low switching current of the antiferromagnetic structure but is useful as a memory cell in an MRAM circuit.

A spin-torque device, such as a tunnel magnetoresistance device, comprises a free side, a nonmagnetic spacer layer and a pinned side. The free side may comprise a single layer or multiple layers; likewise, the pinned side may comprise a single layer or multiple layers. The nonmagnetic spacer layer comprises either a tunnel barrier layer or a metallic layer. The tunnel barrier layer comprises an electrically insulating material through which electrons tunnel when the tunnel barrier layer is appropriately biased with voltage. The metallic layer comprises an electrically conductive nonmagnetic metal layer. When reading the state of the tunnel magnetoresistance device, the output signal is generated from the magnetoresistance signals across the nonmagnetic spacer layer. The magnetoresistance signal is due to tunneling magnetoresistance if the nonmagnetic spacer is the tunnel barrier layer or to giant magnetoresistance if the spacer is the metallic layer.

Figure 2:
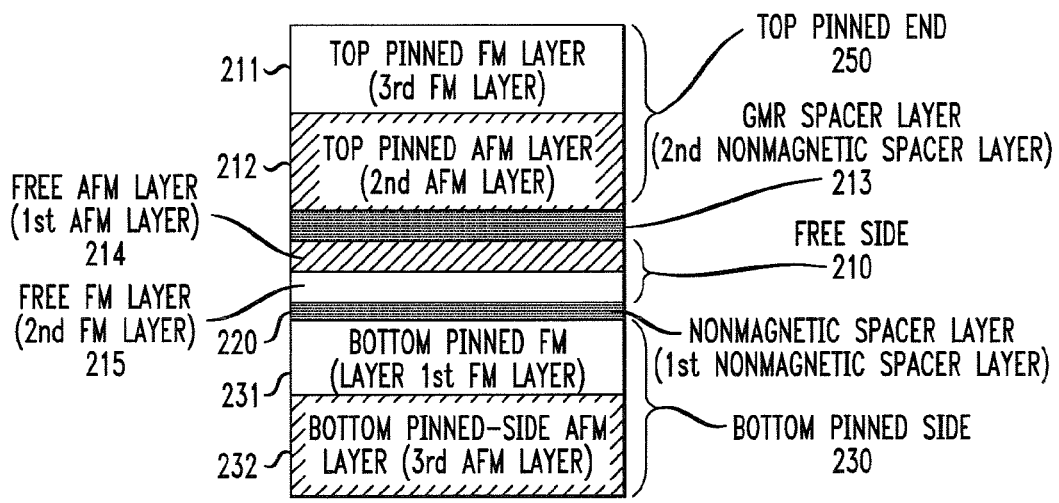
FIG. 2 illustrates a spin-torque structure, according to an embodiment of the present invention.

As illustrated in FIG. 2, a spin-torque structure 200, according to an embodiment of the invention, comprises a free side 210, a bottom pinned side 230, a top pinned end 250, a GMR spacer layer 213 and a nonmagnetic spacer layer 220. The free side 210 comprises a relatively thin free FM layer 215 abutting and strongly exchange coupled to a free AFM layer 214. The free FM layer 215 abuts the nonmagnetic spacer layer 220, allowing for relatively large and relatively small resistances, associated with magnetoresistance or giant magnetoresistance, for readout. The interface between the nonmagnetic spacer layer 220 and the free FM layer 215 produces only a relatively small amount of spin-torque to help switch or write the spin-torque structure 200. The GMR spacer layer 213 abuts the free AFM layer 214 and a top pinned AFM layer 212 that abuts and is exchange coupled to a top pinned FM layer 211. The top pinned end 250 comprises the top pinned AFM layer 212 and the top pinned FM layer 211. A spin-torque device, such as an MRAM cell, comprises, for example, the spin-torque structure 200. An MRAM, comprising one or more of the MRAM memory cells, may further comprise other electronic devices or structures such as electronic devices comprising silicon, a transistor, a field-effect transistor, a bipolar transistor, a metal-oxide-semiconductor transistor, a diode, a resistor, a capacitor, an inductor, another memory device, interconnect, an analog circuit and a digital circuit. Data stored within the MRAM memory cell corresponds to the direction of a magnetic moment the free FM layer 215.

The majority of spin-torque for switching or writing the spin-torque structure 200 comes from layers and interfaces above the free AFM layer 214. Above the free AFM layer 214, there is a free AFM layer 214 to GMR spacer layer 213 interface, the GMR spacer layer 213, the GMR spacer layer 213 to top pinned layer 212 interface, and the top pinned AFM layer 212 producing, during switching or writing, relatively large spin-torque on the free FM layer 215.

The free AFM layer 214, the GMR spacer layer 213 and the top pinned AFM layer 212 are adapted to provide the majority of spin-torque for switching magnetic polarization of the free FM layer 215. The top pinned AFM layer 212 is pinned by having the top pinned AFM layer 212 thicker than the free AFM layer 214, and also by having the top pinned FM layer 211 on top of, and exchange coupled to, the top pinned AFM layer 212.

The bottom pinned side 230 comprises a bottom pinned FM layer 231 and a bottom pinned-side AFM layer 232 abutting and exchange coupled to the bottom pinned FM layer 231. One or both of the top pinned FM layer 211 and the bottom pinned FM layer 231 may comprise, for example, an anti-parallel (AP) layer comprising a first 2 nanometer (nm) thick layer comprising a first alloy of cobalt and iron (CoFe), a 0.8 nm ruthenium (Ru) layer, and a second 2 nm thick layer comprising a second alloy of cobalt and iron (CoFe). Alternately, the top pinned FM layer 211 and/or the bottom pinned FM layer 231 may comprise simple pinned layers, for example, a 3 nm thick layer of a third alloy of cobalt and iron (CoFe). The nonmagnetic spacer layer 220, for example, may comprise magnesium oxide (MgO) as a tunnel barrier layer. The bottom pinned-side AFM layer 232 is strongly exchange coupled to the bottom pinned FM layer 231 pinning the bottom pinned FM layer 231. The bottom pinned-side AFM layer 232 is used to pin the bottom pinned FM layer 231 to a particular alignment.

The free FM layer 215 is relatively thin, for example, just thick enough to get good magnetoresistance across the nonmagnetic spacer layer 220. An exemplary thickness of the free FM layer 215 is between 0.2 nm and 1 nm. The free FM layer 215 comprises, for example, an alloy containing at least one of Fe, Co, and Ni, such as CoFe.

The free AFM layer 214 may provide thermal stability of the free combination-layer 240, including thermal stability of the free FM layer 215, by virtue of crystalline anisotropy of the free AFM layer 214. Any or all of the free AFM layer 214, the bottom pinned-side AFM layer 232 and the top pinned AFM layer 212 may comprise, for example, an alloy of manganese (Mn) such as an alloy comprising iridium and manganese (IrMn), an alloy comprising platinum and manganese (PtMn), an alloy comprising iron and manganese (FeMn), and an alloy comprising nickel and manganese (NiMn). Alternately, the free AFM layer 214, the bottom pinned-side AFM layer 232 and the top pinned AFM layer 211 may comprises different AFM materials. The free AFM layer 214 can be composed of either the same or different material as the material in the bottom pinned-side AFM layer 232 and as in the top pinned AFM layer 211. The thickness of the free AFM layer 214 is, for example, in the range of 2 nm to 20 nm. If composed of the same material as the bottom pinned-side AFM layer 232 and/or the top pinned AFM layer 211, the free AFM layer 214 should be thinner than the bottom pinned-side AFM layer 232 and/or the top pinned AFM layer 211.

The GMR spacer layer 213 comprises a nonmagnetic metal, for example, Cu, Au, or Ru. The nonmagnetic metal is used to separate the free AFM layer 214 from the top pinned AFM layer 212.

Figure 3:
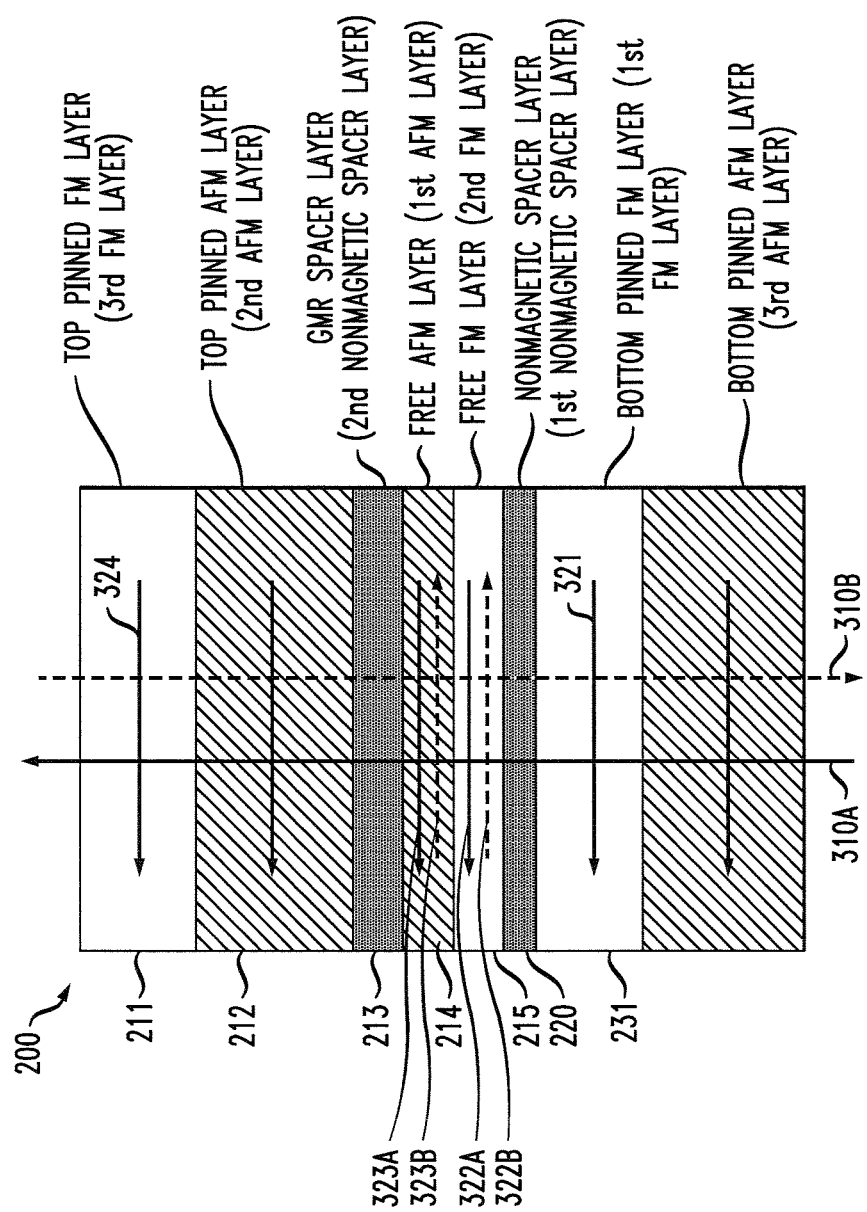
FIG. 3 illustrates writing to a spin-torque structure, according to an embodiment of the present invention.

FIG. 3 shows the write operation of the spin-torque structure 300. The spin-torque structure 300 comprised the spin-torque structure 200 with a write current applied. Writing, in one case, is accomplished by an upwards write current 310A, comprising a flow of electrons driven vertically through the spin-torque structure 200. The direction of the arrows on the heavy vertical lines points in the direction of electron flow. To change the data state of the spin-torque structure 200, the write current switches magnetic moments of the free FM layer 215 and the free AFM layer 214 together. If a magnetic moment 321 of the bottom pinned FM layer 231 points, for example, to the left, the electrons flowing within upwards write current 310A will be spin-polarized to the left and therefore place a torque on the free FM layer 215 to switch a magnetic moment 322A of the free FM layer 215 to the left. Furthermore a surface magnetic moment 323A of the free AFM layer 214 will also be switched to the left. As electrons flowing upwards in upwards write current 310A are incident on the top pinned AFM layer 212, also spin-polarized, for example, to the left, some electrons will reflect back to the free AFM layer 214 and the free FM layer 215 with a spin-polarization to the left, thus also placing a torque to switch the magnetic moment 322A of the free FM layer 215 and the surface magnetic moment 323B of the free AFM layer 214 to the left. If the data state already corresponded to the data state that otherwise would be induced by the upwards write current 310A, the magnetic moment 322A of the free FM layer 215 and the surface magnetic moment 323A of the free AFM layer 214 were already set to the left and will not be switched by the upwards write current 310A Conversely, if the flow of electrons is in the opposite direction (downward) as in the downward write current 310B, the electrons will be spin-polarized to the right, and a magnetic moment 322B of the free FM layer 215 and the surface magnetic moment 323B of the free AFM layer 214 will be switched to the right when changing the data state. If the data state already corresponded to the data state that otherwise would be induced by the downward write current 310B, the magnetic moment 322B of the free FM layer 215 and the surface magnetic moment 323B of the free AFM layer 214 were already set to the right and will not be switched by the downwards write current 310B.

The switching is the result of spin-torque mediated from the top pinned AFM layer 212 across the GMR spacer layer 213, to the free AFM layer 214. There may also be a component of spin-torque from the bottom pinned side 230, mediated across the nonmagnetic spacer layer 220.

The direction of the first magnetic moment 321 and a fourth magnetic moment 324 of the top pinned FM layer 211, for example, are set using a high-temperature anneal in an applied magnetic field.

Consider reading the spin-torque structure 200. In one embodiment, a read current, less than the write current, is applied to read the resistance of the nonmagnetic spacer layer 220. The read current is applied across the spin-torque structure 200 to flow through the spin-torque structure 200 from top to bottom or from bottom to top. The resistance of the nonmagnetic spacer layer 220 depends on the relative magnetic orientations (directions of magnetic moments) of the free FM layer 215 and the bottom pinned FM layer 231. If the magnetic orientations are parallel, the resistance of the nonmagnetic spacer layer 220 is relatively low. If the magnetic orientations are anti-parallel, the resistance of the nonmagnetic spacer layer 220 is relatively high. As previously stated, the resistance of the nonmagnetic spacer layer 220 is due to tunneling magnetoresistance if the nonmagnetic spacer layer 220 is an electrical insulator or to giant magnetoresistance if the nonmagnetic spacer layer 220 is a nonmagnetic metal. Measuring the voltage across the spin-torque structure 200, corresponding to the applied read current, allows for calculation of the resistance across the spin-torque structure 200 according to ohms law. Because the resistance of the nonmagnetic spacer layer 220 dominates the series resistance of the layer within the spin-torque structure 200, the resistance of the nonmagnetic spacer layer 220 is obtained, to some degree of accuracy, by measuring the resistance of the spin-torque structure 200. In an alternate embodiment, a read voltage is applied across the spin-torque structure 200 and a current is measured from which the resistance of the spin-torque structure 200 is calculated. In many embodiments, the resistance of the GMR spacer layer 213 does not contribute substantially, in relationship to the resistance of the nonmagnetic spacer layer 220, to the resistance of the spin-torque structure 200. Furthermore, the resistances of the layers, other than the nonmagnetic spacer layer 220, within the spin-torque structure 200 are comparatively less than the resistance of the nonmagnetic spacer layer 220.

Consider a write current of a spin-torque structure according to an embodiment of the invention (e.g., the spin-torque structure 200) compared to a comparison write current of a comparison spin-torque transfer magnetoresistive structure comprising (i) a comparison structure free ferromagnetic layer abutted on one side by a comparison structure nonmagnetic spacer layer and abutted on another side by a terminal, (ii) a comparison structure ferromagnetic layer or another comparison structure nonmagnetic spacer layer. An aspect of the invention is lower write current than the comparison write current. For the spin-torque structure according to an embodiment of the invention, the magnitude of the write current which is necessary to switch a magnetic moment of a free FM layer (e.g., the free ferromagnetic layer 215) is less than the comparison write current which is necessary to switch a comparison structure magnetic moment of a comparison structure free FM layer in the comparison spin-torque transfer magnetoresistive structure. The write current required for the spin-torque structure of the invention is, for example, less than ten percent of the write current required for the comparison spin-torque transfer magnetoresistive structure.

FIG. 4 illustrates a method 400 for forming a spin-torque structure, according to an embodiment of the invention. For example, the spin-torque structure comprises the spin-torque structure 200 or an MRAM memory cell. The steps of method 400 may occur in orders other than that illustrated.

The first step 410 comprises forming a first FM layer. The first FM layer comprises a pinned layer, for example the bottom pinned FM layer 231.

The second step 420 comprises forming a first nonmagnetic spacer layer. The first nonmagnetic spacer layer comprises a tunnel barrier or a nonmagnetic metal. For example, the first nonmagnetic spacer layer comprises the nonmagnetic spacer layer 220. The first nonmagnetic spacer layer abuts the first FM layer.

The third step 430 comprises forming a second FM layer. The second FM layer comprises a free FM layer, for example, the free FM layer 215. The second FM layer abuts the first nonmagnetic spacer layer.

The fourth step 440 comprises forming a first AFM layer. The first AFM layer comprises a free layer that is exchange coupled and abutting the second FM layer. For example, the first AFM layer comprises the free AFM layer 214. Within embodiments of the invention, for example, an MRAM memory cell, directions of magnetic moments of the second FM layer and of the first AFM layer are switched when a write current of the appropriate polarity is applied across the spin-torque structure. After switching, the directions of magnetic moments of the second FM layer and of the first AFM layer are parallel and, for example, store the data state of the MRAM memory cell.

The fifth step 450 comprises forming a second nonmagnetic spacer layer. The second nonmagnetic spacer layer comprises a layer of nonmagnetic metal or a GMR spacer layer. For example, the second nonmagnetic spacer layer comprises the GMR spacer layer 213. The second nonmagnetic spacer layer abuts the first AFM layer.

The sixth step 460 comprises forming a second AFM layer. The second AFM layer comprises a pinned AFM layer, for example, the top pinned AFM layer 212. The second AFM layer abuts the second nonmagnetic spacer layer. The first AFM layer, the second nonmagnetic spacer layer and the second AFM layer comprise a substructure that is adapted to provide the majority of spin-torque for switching magnetic polarization of the second FM layer, and to enable switching magnetic polarization of the second FM layer using relatively low magnitudes of write current.

The seventh step 470 comprises forming a third AFM layer comprising a pinned AFM layer, for example the bottom pinned-side AFM layer 232. The third AFM layer abuts and is exchange coupled to the first FM layer.

The eighth step 480 comprises forming a third FM layer comprising a pinned FM layer, for example, the top pinned FM layer 211. The third FM layer abuts and is exchange coupled to the second AFM layer.

FIG. 5 is a cross-sectional view depicting an exemplary packaged integrated circuit 500 according to an embodiment of the present invention. The packaged integrated circuit 500 comprises a leadframe 502, a die 504 attached to the leadframe, and a plastic encapsulation mold 508. Although FIG. 5 shows only one type of integrated circuit package, the invention is not so limited; the invention may comprise an integrated circuit die enclosed in any package type.

The die 504 includes a device described herein, and may include other structures or circuits. For example, the die 504 includes at least one spin-torque structure or MRAM according to embodiments of the invention, for example, the spin-torque structures 200, and embodiments formed according to the method of the invention (e.g., the method of FIG. 4). For example, the other structures or circuits may comprise electronic devices comprising silicon, a transistor, a field-effect transistor, a bipolar transistor, a metal-oxide-semiconductor transistor, a diode, a resistor, a capacitor, an inductor, another memory device, interconnect, an analog circuit and a digital circuit. The spin torque structure or MRAM may be formed upon or within a semiconductor substrate, the die also comprising the substrate.

An integrated circuit in accordance with the present invention can be employed in applications, hardware and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A magnetoresistive structure comprising:
a first pinned ferromagnetic layer;
a first nonmagnetic spacer layer in physical contact with the first pinned ferromagnetic layer;
a free side stack comprising:
  a second free ferromagnetic layer in physical contact with the first nonmagnetic spacer layer, wherein the second free ferromagnetic layer has a first thickness; and
  a first free antiferromagnetic layer in physical contact with the second free ferromagnetic layer, wherein the first free antiferromagnetic layer has a second thickness;
a second nonmagnetic spacer layer in physical contact with the first free antiferromagnetic layer; and
a pinned stack comprising:
  a second pinned antiferromagnetic layer in physical contact with the second nonmagnetic spacer layer, wherein the second pinned antiferromagnetic layer has a third thickness; and
  a third pinned ferromagnetic layer in physical contact with the second pinned antiferromagnetic layer;
wherein the first and second nonmagnetic spacer layers are formed of non-ferromagnetic and non-antiferromagnetic material, and
wherein the third thickness is greater than the second thickness, and wherein the second thickness is greater than the first thickness.

2. The magnetoresistive structure of claim 1 further comprising:
a third pinned antiferromagnetic layer proximate to and exchange coupled to the first pinned ferromagnetic layer.

3. The magnetoresistive structure of claim 1, wherein the first nonmagnetic spacer layer comprises at least one of a tunneling barrier layer, magnesium oxide, and a nonmagnetic metallic layer.

4. The magnetoresistive structure of claim 1, wherein the second nonmagnetic spacer layer comprises at least one of a nonmagnetic metallic layer and a giant magnetoresistance layer.

5. The magnetoresistive structure of claim 1, wherein at least one of: i) the first free antiferromagnetic layer comprises chromium, ii) the second pinned antiferromagnetic layer comprises chromium, and iii) the second nonmagnetic spacer layer comprises at least one of gold, copper, and ruthenium.

6. The magnetoresistive structure of claim 1, wherein the second free ferromagnetic layer is exchange coupled to the first free antiferromagnetic layer.

7. The magnetoresistive structure of claim 1, wherein first free antiferromagnetic layer, the second nonmagnetic spacer layer, and the second pinned antiferromagnetic layer are adapted to provide a majority of spin-torque for switching magnetic polarization of the second free ferromagnetic layer.

8. The magnetoresistive structure of claim 1, wherein the second pinned antiferromagnetic layer is pinned by at least one of: i) the third pinned ferromagnetic layer, and ii) the second pinned antiferromagnetic layer.

9. The magnetoresistive structure of claim 1, wherein at least one of the first pinned ferromagnetic layer and the third pinned ferromagnetic layer comprises at least one of: i) an alloy of cobalt and iron, and ii) a plurality of sub-layers, wherein two of the plurality of sub-layers have anti-parallel magnetic moments.

10. The magnetoresistive structure of claim 1, wherein the second free ferromagnetic layer comprises an alloy comprising at least one of iron, cobalt, and nickel.

11. The magnetoresistive structure of claim 1, wherein at least one of the first free antiferromagnetic layer, the second pinned antiferromagnetic layer and the third pinned antiferromagnetic layer comprises an alloy, and wherein the alloy comprises at least one member selected from a group consisting of manganese, iridium, nickel, platinum and iron.

12. The magnetoresistive structure of claim 1 adapted for switching of magnetic moments of both the second free ferromagnetic layer and the first free antiferromagnetic layer by a write current.

13. The magnetoresistive structure of claim 1, wherein the magnitude of a write current necessary to switch a magnetic moment of the second free ferromagnetic layer is less than a comparison write current necessary to switch a comparison magnetic moment of a comparison free ferromagnetic layer in a comparison magnetoresistive structure comprising the comparison free ferromagnetic layer abutted on one side by a comparison nonmagnetic spacer layer and abutted on another side by at least one of a device terminal, another comparison nonmagnetic spacer layer and a comparison ferromagnetic layer.

14. The magnetoresistive structure of claim 1, wherein the first free antiferromagnetic layer is adapted to provide thermal stability for the second free ferromagnetic layer.

15. A magnetoresistive memory device comprising:
a first pinned ferromagnetic layer;
a first nonmagnetic spacer layer in physical contact with the first pinned ferromagnetic layer;
a free side stack comprising:
second free ferromagnetic layer in physical contact with the first nonmagnetic spacer layer, wherein the second free ferromagnetic layer has a first thickness; and
a first free antiferromagnetic layer in physical contact with the second free ferromagnetic layer, wherein the first free antiferromagnetic layer has a second thickness;
a second nonmagnetic spacer layer in physical contact with the first free antiferromagnetic layer; and
a pinned stack comprising:
a second pinned antiferromagnetic layer in physical contact with the second nonmagnetic spacer layer, wherein the second pinned antiferromagnetic layer has a third thickness; and
a third pinned ferromagnetic layer in physical contact with the second pinned antiferromagnetic layer;
wherein the first and second nonmagnetic spacer layers are formed of non-ferromagnetic and non-antiferromagnetic material,
wherein the third thickness is greater than the second thickness, and wherein the second thickness is greater than the first thickness, and wherein the magnetoresistive memory device stores at least two data states corresponding to at least two directions of a magnetic moment.

16. The magnetoresistive memory device of claim 15, wherein the first free antiferromagnetic layer, the second nonmagnetic spacer layer, and the second pinned antiferromagnetic layer are adapted to provide a majority of spin-torque for switching magnetic polarization of the second free ferromagnetic layer.

17. The magnetoresistive memory device of claim 15, wherein data stored within a memory cell corresponds to the direction of a magnetic moment in at least one of the second free ferromagnetic layer and the first free antiferromagnetic layer.

18. An integrated circuit comprising:
a substrate;
a spin torque structure formed on the substrate, wherein the spin-torque structure comprises:
a first pinned ferromagnetic layer;
a first nonmagnetic spacer layer in physical contact with the first pinned ferromagnetic layer;
a free side stack comprising:
a second free ferromagnetic layer in physical contact with the first nonmagnetic spacer layer, wherein the second free ferromagnetic layer has a first thickness; and
a first free antiferromagnetic layer in physical contact with the second free ferromagnetic layer, wherein the first free antiferromagnetic layer has a second thickness;
a second nonmagnetic spacer layer in physical contact with the first free antiferromagnetic layer; and
a pinned stack comprising:
a second pinned antiferromagnetic layer in physical contact with the second nonmagnetic spacer layer, wherein the second pinned antiferromagnetic layer has a third thickness; and
a third pinned ferromagnetic layer in physical contact with the second pinned antiferromagnetic layer;
wherein the first and second nonmagnetic spacer layers are formed of non-ferromagnetic and non-antiferromagnetic material, and
wherein the third thickness is greater than the second thickness, and wherein the second thickness is greater than the first thickness.

19. The integrated circuit of claim 18, wherein at least one of the first free antiferromagnetic layer, the second nonmagnetic spacer layer, and the second pinned antiferromagnetic layer are adapted to provide a majority of spin-torque for switching magnetic polarization of the second free ferromagnetic layer.

20. A method for forming a spin-torque structure, the method comprising the steps of:
forming a first pinned ferromagnetic layer;
forming a first nonmagnetic spacer layer in physical contact with the first pinned ferromagnetic layer;
forming a free side stack, which comprises:
forming a second free ferromagnetic layer in physical contact with the first nonmagnetic spacer layer, wherein the second free ferromagnetic layer has a first thickness; and
forming a first free antiferromagnetic layer in physical contact with the second free ferromagnetic layer, wherein the first free antiferromagnetic layer has a second thickness;

forming a second nonmagnetic spacer layer in physical contact with the first free antiferromagnetic layer; and
forming a pinned stack, which comprises:
   forming a second pinned antiferromagnetic layer in physical contact with the second nonmagnetic spacer layer, wherein the second pinned antiferromagnetic layer has a third thickness; and
   forming a third pinned ferromagnetic layer in physical contact with the second pinned antiferromagnetic layer,
wherein the first and second nonmagnetic spacer layers are formed of non-ferromagnetic and non-antiferromagnetic material, and
wherein the third thickness is greater than the second thickness, and wherein the second thickness is greater than the first thickness.

* * * * *